United States Patent
Wahl et al.

(10) Patent No.: US 9,306,064 B2
(45) Date of Patent: Apr. 5, 2016

(54) SEMICONDUCTOR DEVICE AND INTEGRATED APPARATUS COMPRISING THE SAME

(71) Applicant: Infineon Technologies Austria AG, Villach (AT)

(72) Inventors: Uwe Wahl, Munich (DE); Armin Willmeroth, Augsburg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/527,815

(22) Filed: Oct. 30, 2014

(65) Prior Publication Data

US 2015/0116031 A1   Apr. 30, 2015

(30) Foreign Application Priority Data

Oct. 30, 2013   (CN) .......................... 2013 2 0675145

(51) Int. Cl.
| | | |
|---|---|---|
| *H01L 29/78* | (2006.01) | |
| *H01L 29/40* | (2006.01) | |
| H01L 27/088 | (2006.01) | |
| H02M 1/08 | (2006.01) | |
| H02M 1/42 | (2007.01) | |
| H02M 3/335 | (2006.01) | |

(52) U.S. Cl.
CPC .......... *H01L 29/7827* (2013.01); *H01L 29/408* (2013.01); *H01L 27/088* (2013.01); *H02M 1/08* (2013.01); *H02M 1/4225* (2013.01); *H02M 3/335* (2013.01)

(58) Field of Classification Search
CPC ... H01L 29/7827; H01L 29/408; H01L 29/78; H01L 27/088
USPC .......................................................... 257/140
See application file for complete search history.

(56) References Cited

U.S. PATENT DOCUMENTS

| | | | |
|---|---|---|---|
| 6,239,463 B1 * | 5/2001 | Williams et al. .............. | 257/328 |
| 8,648,643 B2 * | 2/2014 | Wu ................................ | 327/419 |
| 2005/0045922 A1 * | 3/2005 | Ahlers et al. .................. | 257/242 |
| 2009/0166729 A1 * | 7/2009 | Zundel et al. ................. | 257/330 |
| 2012/0025202 A1 * | 2/2012 | Makabe et al. ................ | 257/76 |
| 2013/0062622 A1 * | 3/2013 | Tsuchiya ........................ | 257/77 |
| 2014/0042461 A1 * | 2/2014 | Tamaso ......................... | 257/77 |
| 2014/0138746 A1 * | 5/2014 | Abrokwah et al. ........... | 257/194 |
| 2014/0246682 A1 * | 9/2014 | Uchida et al. ................. | 257/77 |
| 2014/0284706 A1 * | 9/2014 | Cheng et al. .................. | 257/329 |
| 2015/0034957 A1 * | 2/2015 | Chiu et al. ..................... | 257/76 |
| 2015/0041825 A1 * | 2/2015 | Liu et al. ........................ | 257/77 |
| 2015/0115354 A1 * | 4/2015 | Kaindl et al. ................. | 257/330 |

* cited by examiner

*Primary Examiner* — Nathan Ha
(74) *Attorney, Agent, or Firm* — Eschweiler & Associates, LLC

(57) ABSTRACT

The present disclosure provides a semiconductor device and an integrated apparatus having the same. The semiconductor device includes a substrate, a buffer layer on the substrate, a compensation area which includes a p-region and a n-region on the buffer layer, and a transistor cell on the compensation area. The transistor cell includes a source region, a body region, a gate electrode and a gate dielectric formed at least between the gate electrode and the body region. The gate dielectric has a thickness in a range of 12 nm to 50 nm.

16 Claims, 3 Drawing Sheets

SEMICONDUCTOR DEVICE AND INTEGRATED APPARATUS COMPRISING THE SAME

CROSS REFERENCE TO RELATED APPLICATION

This application claims priority to Chinese Patent Application serial number 201320675145.2 filed on Oct. 30, 2013 and is hereby incorporated in its entirety.

FIELD

This disclosure relates to a semiconductor device and an integrated apparatus comprising the same, and in particular, to a super-junction device having logic level threshold voltage and an integrated apparatus comprising the same.

BACKGROUND

Superjunction devices exploit the idea to compensate surplus charges in the on-state current path by adding charges of the opposite polarity in the vicinity of this area to achieve very low area specific $R_{DSon}$ values. Typical constructions for vertical devices use vertical n- and p-doped columns which are formed either by trench etching and refill or by multi epitaxial arrangements.

This very low specific $R_{DSon}$ values enable very small device areas (w/r to standard MOSFETs) leading to very fast switching devices (low capacitances $C_{GD}$, $C_{GS}$, $C_{DS}$). Fast switching is the basis for very low switching losses for example in switch mode power supplies which had boosted their efficiency significantly in recent years.

To have sufficient noise immunity state of the art super-junction devices have stayed with gate threshold voltage in the range of 3.5V to 5V reaching full turn-on with Gate voltages around 10 to 12V.

This hampers further efficiency improvements as switching speed and therefore switching losses are closely linked to the voltage swing needed for full turn-on.

Drawbacks of the existing solutions with Vth >3.5V are:
higher switching losses than with lower gate threshold voltage.
higher driving losses; devices with lower gate threshold voltage can be driven by the same driving current much faster or with the same speed with less driving power.
state of the art power devices can't be driven directly with TTL or CMOS stages; they need a booster/level-shifter stage.

FIG. 2a shows state of the art PFC (Power Factor Correction) stage 20 using a power MOSFET 22 having a normal level threshold voltage, e.g., Vth=3V to 5V. This solution needs after the controller 24 generating the PWM for voltage/current control an additional booster stage 26 which generates gate voltages for the power MOSFET 22 in the range of 10V to 15V with an appropriate current level. Despite the additional booster stage 26 this solution usually needs an additional voltage domain (e.g., 20V to 30V) to supply the booster 26 and support the driving of the power MOSFET 22. However this means additional effort either in terms of additional device cost, area, and higher losses.

A similar example is shown in FIG. 3a. FIG. 3a shows a Flyback topology 30 which uses state of the art a power MOSFET 32 having normal level threshold voltage, e.g., Vth=3-5V. This solution needs after the controller 34 generating the PWM for voltage/current control an additional booster stage 36 which generates gate voltages for the power MOSFET 32 in the range of 10V to 15V with an appropriate current level. Despite the additional booster stage 36 this solution usually needs an additional voltage domain (e.g., 20V to 30V) to supply the booster 36 and support the driving of the power MOSFET 32. However this means additional effort either in terms of additional device cost, area, and higher losses.

Therefore, there is the need for a structure having lower logic level threshold voltage at the same time having sufficient noise immunity.

SUMMARY

To overcome the above mentioned drawbacks, this disclosure proposes to implement logic level Vth of 1.2V to 2V, preferably of 1.6V, for superjunction MOSFETs. Here, Vth is gate threshold voltage of the superjunction MOSFET. For these devices, the $R_{DSon}$ is then rated at $V_{GS}$=4.5V. Nevertheless these devices should also be able to withstand $V_{GS}$ voltages of about 10V to handle voltage spikes without gate oxide degradation. The implementation can be done by using gate oxides of an appropriate thickness in a range of 12 nm to 50 nm and an adjusted doping level of the channel region.

To improve the possibly resulting low noise immunity, it is additionally proposed to integrate the gate driver and/or the controller stage very close to the power MOSFET to minimize the gate loop. The integration can either be done monolithically, chip-by-chip or chip-on-chip.

These measures will lead to a significant efficiency improvement by reducing switching losses as well as driving losses. The approach also gives design in advantages as the design engineer has not to take care for the signal integrity and gains board space with a more integrated solution.

Therefore, according to one embodiment of the present disclosure, a semiconductor device is provided, which comprises a substrate, and a buffer layer on the substrate. The semiconductor device further comprises a compensation area which comprises a p-region and a n-region on the buffer layer, and a transistor cell on the compensation area, the transistor cell comprising a source region, a body region, a gate electrode and a gate dielectric formed at least between the gate electrode and the body region. In one embodiment the gate dielectric has a thickness in a range of 12 nm to 50 nm.

In some embodiments, the semiconductor device has gate threshold voltage in a range of 1V to 2V.

In some embodiments, the semiconductor device has gate threshold voltage in a range of 1.2V to 2V.

In some embodiments, the semiconductor device has gate threshold voltage of 1.6V.

In some embodiments, the buffer layer has a doping concentration lower than the n-region.

In some embodiments, the buffer layer has a doping concentration increasing towards the substrate.

In some embodiments, the buffer layer comprises a first sublayer on the substrate and a second sublayer on the first sublayer, and the doping for the second sublayer is above that of the first sublayer.

In some embodiments, the buffer layer comprises a first part on the substrate and a second part on the first part, and the first part has a doping concentration increasing towards the substrate.

In some embodiments, the semiconductor device is a super-junction device.

According to another embodiment of the disclosure, an integrated apparatus is provided, which comprises any one of the semiconductor devices as stated above and a controller integrated with the semiconductor device for controlling an operation of the semiconductor device, wherein the semiconductor device is directly driven by the controller.

In some embodiments, the controller is integrated with the semiconductor device monolithically, chip-by-chip or chip-on-chip.

In some embodiments, the integrated apparatus is in a Flyback topology structure.

In some embodiments, the integrated apparatus is in a LLC topology structure.

In some embodiments, the integrated apparatus is in a TTF topology structure.

In some embodiments, the integrated apparatus is in a ZVS topology structure.

In some embodiments, the integrated apparatus is in a PFC stage structure.

BRIEF DESCRIPTION OF THE DRAWINGS

These and other features and advantages of the present disclosure will be apparent from the following detailed description with reference to the accompanying drawings, in which.

DETAILED DESCRIPTION

Figure 1:
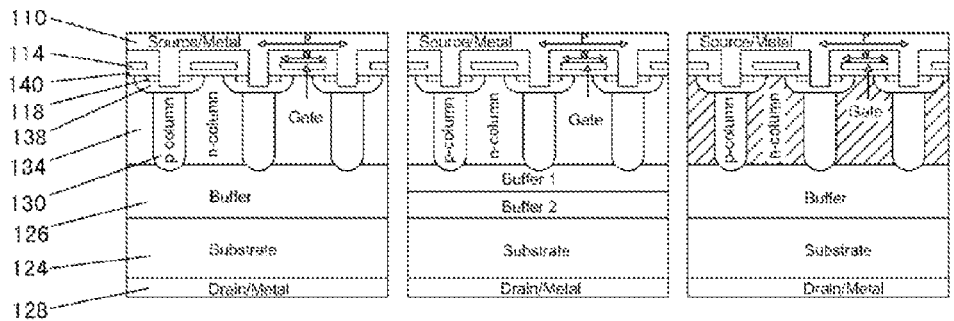
FIG. 1 schematically shows cross-sectional views of three not limiting examples for super-junction transistors according to the present disclosure.

Embodiments of the present disclosure now will be described more fully hereinafter with reference to the accompanying drawings, in which embodiments of the disclosure are shown. The present disclosure may, however, be embodied in many different forms and should not be construed as limited to the embodiments set forth herein; rather, these embodiments are provided so that this disclosure will be thorough and complete, and will fully convey the scope of the disclosure to those skilled in the art. Like numbers refer to like elements throughout. Furthermore, the various layers and regions illustrated in the figures are illustrated schematically and are not necessarily drawn to scale. Accordingly, the present disclosure is not limited to the relative size, spacing and alignment illustrated in the accompanying figures. As will also be appreciated by those of skill in the art, references herein to a layer formed "on" a substrate or other layer may refer to the layer formed directly on the substrate or other layer or on an intervening layer or layers formed on the substrate or other layer. Moreover, the terms "first conductivity type" and "second conductivity type" refer to opposite conductivity types such as N or P-type, however, each embodiment described and illustrated herein includes its complementary embodiment as well.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.)

The figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

FIG. 1 schematically shows cross-sectional views of three not limiting examples for super-junction transistors according to the present disclosure. Different possibilities for realizing a compensation area and an optional buffer region are shown, wherein p is indicating the cell pitch, w is indicating the gate electrode dimension. These examples are not limiting and the different versions may be combined in any manner. For simplicity, only cross sections of a part of the active area, i.e. the area carrying the vertical load current, are shown. Parts of the transistors like an edge termination system, a dicing area or the gate connects are not explicitly shown in FIG. 1. The devices shown have a semiconductor body with a compensation area comprising p-regions (p-columns) 130 and n-regions (n-columns) 134 where the compensation, i.e. the difference in the doping between p- and n-columns may be either homogeneous or variable in the vertical direction.

The compensation region is connected to a MOS transistor cell comprising a source region 118, a body region 138 and a controlling gate 114. In the examples shown the gate is built as a planar gate electrode situated on top of the semiconductor body. However, the gate could also be realized in a trench etched into the semiconductor body.

An insulating structure 140, such as oxide, electrically isolates the gate 114 from the body region 138, the source region 118, the n-regions (n-columns) 134 and a metallization layer 110. And a part of the insulating structure 140 below the gate 114 may act as a gate insulating layer.

The drain 128 of the transistor is connected to a highly doped substrate 124. Between the substrate and the compensation area an optional buffer layer 126 may be located. The buffer layer has the same conductivity type as the substrate but a lower doping. The doping of the buffer layer may vary in the vertical direction. As an example the cross section shown in the middle of FIG. 1 depicts stepwise varying doping levels in the buffer layer. For example, the buffer layer may include a plurality of sublayers, such as a first sublayer (buffer 1) and a second sublayer (buffer 2), and the doping for the second sublayer may be above that of the first sublayer. As an example again, the cross section shown in the right of FIG. 1 depicts the doping for the n-regions (n-columns) 134 increase step-wise and/or gradually in a direction from the insulating structure 140 to the buffer layer 126. According to an embodiment (not shown in FIG. 2) the doping of the n-regions (n-columns) and/or the doping of the p-regions (p-columns) may have one or more local doping maximums and one or more local doping minimums in a direction from the insulating structure 140 to the buffer layer 126.

The source contacts are electrically connected by the metallization layer 110 which builds a common source pad at chip top side. The individual cell gates 114 are connected by poly silicon to build a common gate contact with a metallization at top side. And hence two electrodes with same or different metallizations, one for source and one for gate, are disposed at device top side and are isolated from each other e.g. by Si-oxide or Si-nitride passivation layers or both. The drain contact is built at the device backside and is covered with metallization 128 of super-junction devices.

Figure 2A:
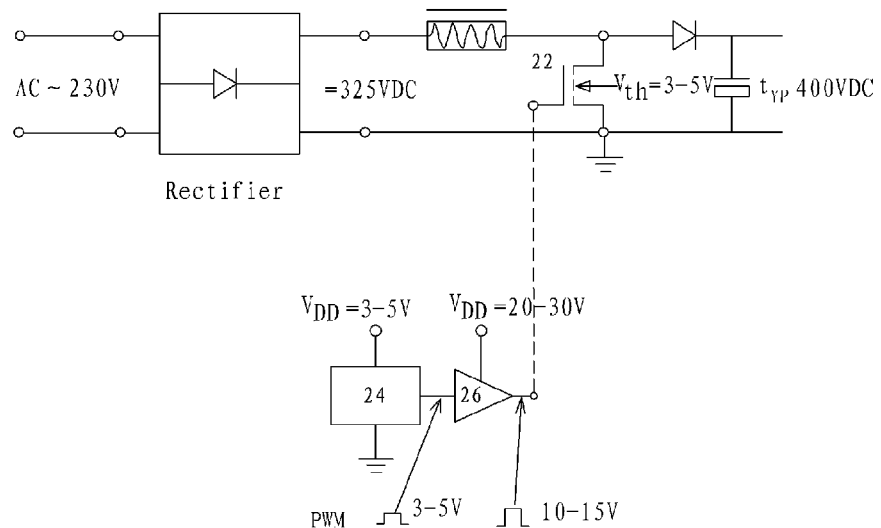
FIG. 2a shows state of the art PFC stage using a power MOSFET having a normal level threshold voltage.
Figure 2B:
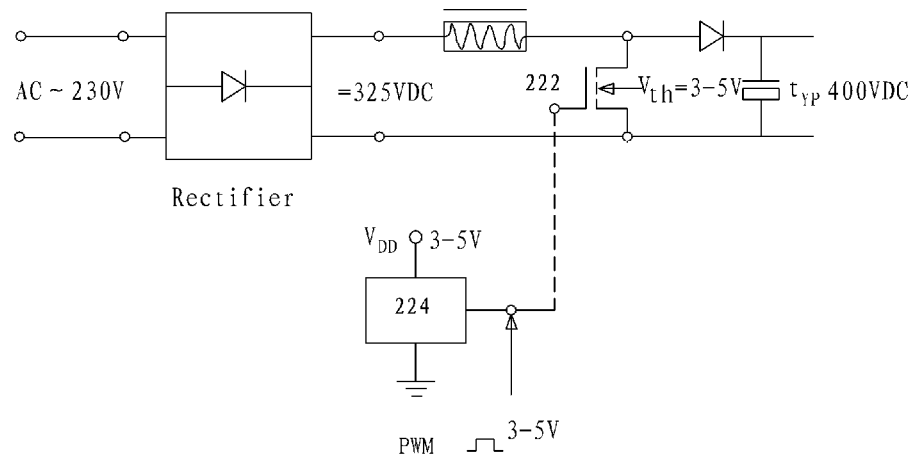
FIG. 2b shows PFC stage using a super-junction MOSFET with logic level threshold voltage according to one embodiment of the present disclosure.

FIG. 2b shows PFC (Power Factor Correction) stage 200 using a super-junction MOSFET 222 with logic level threshold voltage according to one embodiment of the present disclosure (in this figure, Logic Level=LL).

In comparison to the state of the art PFC stage 20 in FIG. 2a, the super-junction MOSFET 222 according to one embodiment of the present disclosure has a logic level threshold voltage in the range of 1-2V, preferably in the range of 1.2-2V, more preferably of 1.6V. In this case, the PFC stage 200 can offer easy control directly from the output of the controller 224 to the super-junction MOSFET 222. In an embodiment, the PFC stage 200 can offer gate voltages for the super-junction MOSFET 222 in the range of 3V to 5V. According to the present disclosure, the logic level threshold voltage in the range of 1-2V can be achieved by using gate oxides of an appropriate thickness (e.g., in the range of 12 nm to 50 nm) and an adjusted doping level of the channel region of the super-junction MOSFET. So, in the present embodiment, since the super-junction MOSFET 222 can be directly driven by the controller 224, the additional booster stage and thus the additional voltage domain as used in the state of the art PFC stage 20 in FIG. 2a can be omitted, thereby the device cost and area can be saved, device switching losses can be reduced, the switching speed of the device can be improved.

Figure 3A:
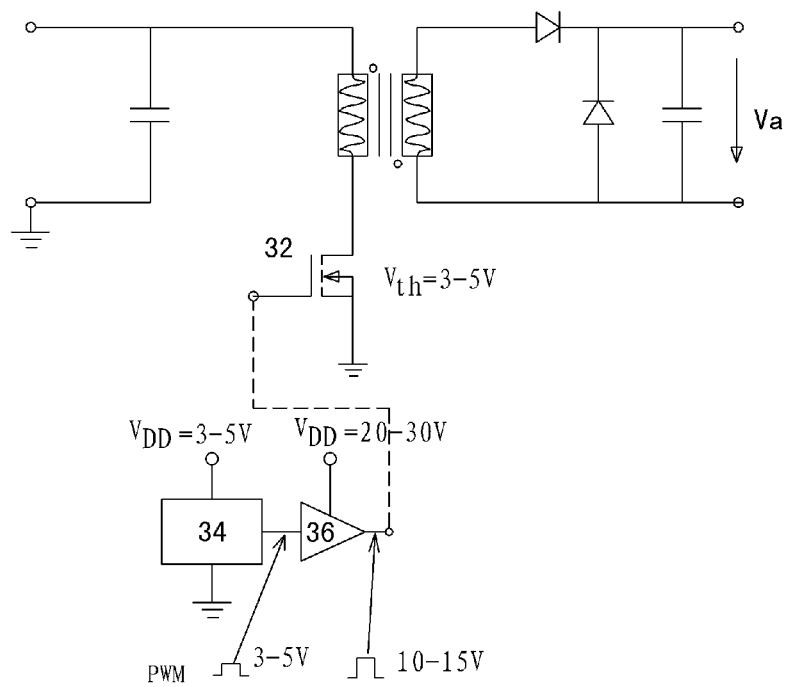
FIG. 3a shows State of the Art Flyback-Converter using a power MOSFET having a normal level threshold voltage.
Figure 3B:
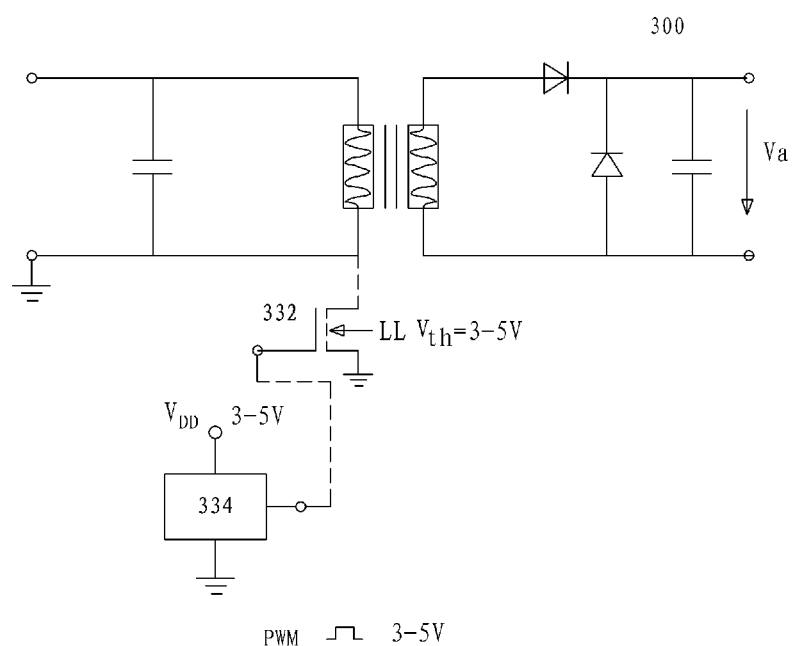
FIG. 3b shows Flyback-Converter using a super-junction MOSFET with logic level threshold voltage according to one embodiment of the present disclosure.

A similar example is shown in FIG. 3b which shows Flyback-Converter 300 using a super-junction MOSFET 332 with logic level threshold voltage according to one embodiment of the present disclosure (in this figure, Logic Level=LL).

In comparison to the state of the art Flyback topology 30 in FIG. 3a, the super-junction MOSFET 332 according to one embodiment of the present disclosure has a logic level threshold voltage in the range of 1-2V, for example, in the range of 1.2-2V, and in another example, 1.6V. In this case, the Flyback-Converter 300 can offer easy control directly from the output of the controller 334 to the super-junction MOSFET 332. In an embodiment, the Flyback-Converter 300 can offer gate voltages for the super-junction MOSFET 332 in the range of 3V to 5V. According to the present disclosure, the logic level threshold voltage in the range of 1-2V can be achieved by using gate oxides of an appropriate thickness (e.g., in the range of 12 nm to 50 nm) and an adjusted doping level of the channel region of the super-junction MOSFET. So, in the present embodiment, since the super-junction MOSFET 332 can be directly driven by the controller 334, the additional booster stage and thus the additional voltage domain as used in the State of the Art Flyback-Converter 30 in FIG. 3a can be omitted, thereby the device cost and area can be saved, device switching losses can be reduced, the switching speed of the device can be improved.

These examples are not limiting can be also adapted to other AC/DC and DC/DC power conversion topologies like LLC (that refers to a configuration of the resonance loop by 2 L (inductance) and 1 C (capacitance)), TTF (Two Transistor Forward) and ZVS (Zero Voltage Switching).

On the other hand, according to the present disclosure, in order to improve the possibly resulting low noise immunity, the gate driver and/or the controller stage may be integrated very close to the Power MOSFET to minimize the gate loop. The integration can either be done monolithically, chip-by-chip or chip-on-chip. These measures will lead to a significant efficiency improvement by reducing switching losses as well as driving losses. The approach also gives design in advantages as the design engineer has not to take care for the signal integrity and gains board space with a more integrated solution.

While the present disclosure and advantages thereof have been described in details by way of the exemplary embodiments, those skilled in the art shall understand that many substitutions and variations may be made to the present disclosure without departing from the spirit and scope of the present disclosure defined by the appended claims.

What is claimed is:

1. A semiconductor device, comprising:
   a substrate;
   a buffer layer on the substrate;
   a compensation area which comprises a p-region and a n-region each on and contacting the buffer layer; and
   a transistor cell on the compensation area, the transistor cell comprising a source region, a body region, a gate electrode and a gate dielectric formed at least between the gate electrode and the body region,
   wherein the gate dielectric has a thickness in a range of 12 nm to 50 nm.

2. The semiconductor device according to claim 1, wherein the semiconductor device has gate threshold voltage in a range of 1V to 2V.

3. The semiconductor device according to claim 2, wherein the semiconductor device has gate threshold voltage in a range of 1.2V to 2V.

4. The semiconductor device according to claim 1, wherein the semiconductor device has gate threshold voltage of 1.6V.

5. The semiconductor device according to claim 1, wherein the buffer layer has a doping concentration lower than the n-region.

6. The semiconductor device according to claim 1, wherein the buffer layer has a doping concentration increasing towards the substrate.

7. The semiconductor device according to claim 1, wherein the buffer layer comprises a first sublayer on the substrate and a second sublayer on the first sublayer, and the doping for the second sublayer is above that of the first sublayer.

8. The semiconductor device according to claim 1, wherein the buffer layer comprises a first part on the substrate and a second part on the first part, and the first part has a doping concentration increasing towards the substrate.

9. The semiconductor device according to claim 1, wherein the semiconductor device is a super-junction device.

10. An integrated apparatus, comprising:
    a semiconductor device comprising:
      a substrate;
      a buffer layer on the substrate;
      a compensation area which comprises a p-region and a n-region each on and contacting the buffer layer; and
      a transistor cell on the compensation area, the transistor cell comprising a source region, a body region, a gate electrode and a gate dielectric formed at least between the gate electrode and the body region,
      wherein the gate dielectric has a thickness in a range of 12 nm to 50 nm; and a controller integrated with the semiconductor device for controlling an operation of the semiconductor device,
wherein the semiconductor device is directly driven by the controller.

11. The integrated apparatus according to claim 10, wherein the controller is integrated with the semiconductor device monolithically, chip-by-chip or chip-on-chip.

12. The integrated apparatus according to claim 10, wherein the integrated apparatus is in a Flyback topology structure.

13. The integrated apparatus according to claim 10, wherein the integrated apparatus is in a LLC topology structure.

14. The integrated apparatus according to claim 10, wherein the integrated apparatus is in a TTF topology structure.

15. The integrated apparatus according to claim 10, wherein the integrated apparatus is in a ZVS topology structure.

16. The integrated apparatus according to claim 10, wherein the integrated apparatus is in a PFC stage structure.

* * * * *